(12) United States Patent
Samoto

(10) Patent No.: US 6,461,889 B1
(45) Date of Patent: Oct. 8, 2002

(54) METHOD OF FABRICATING SEMICONDUCTOR DEVICE WITH DIAMOND SUBSTRATE

(75) Inventor: Norihiko Samoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/375,485

(22) Filed: Aug. 17, 1999

(30) Foreign Application Priority Data

Aug. 17, 1998 (JP) ............................................. 10-230747

(51) Int. Cl.⁷ ............................................. H01L 23/367
(52) U.S. Cl. ........................................ 438/105; 438/122
(58) Field of Search .................................. 438/122, 105, 438/455, 458; 257/712

(56) References Cited

U.S. PATENT DOCUMENTS

| | | | | |
|---|---|---|---|---|
| 5,107,315 A | * | 4/1992 | Kumagai et al. | 357/23.15 |
| 5,874,775 A | * | 2/1999 | Shiomi et al. | 257/712 |
| 5,976,909 A | * | 11/1999 | Shiomi et al. | 438/105 |
| 6,190,937 B1 | * | 2/2001 | Nakagawa et al. | 438/67 |

FOREIGN PATENT DOCUMENTS

| | | |
|---|---|---|
| JP | 02-110968 | 4/1990 |
| JP | 02-206118 | 8/1990 |
| JP | 5-166849 | 7/1993 |
| JP | 06-132432 | 5/1994 |
| JP | 09-232338 | * 9/1997 |

* cited by examiner

*Primary Examiner*—David Nelms
*Assistant Examiner*—Thao Phuong Le
(74) *Attorney, Agent, or Firm*—Sughrue Mion, PLLC

(57) ABSTRACT

A method of fabricating a semiconductor device that makes it possible to decrease the thermal resistance of the semiconductor device is provided. First, a semiconductor base layer is formed over a main surface of a semiconductor substrate. Then, the semiconductor base layer on which the at least one device structure has been formed is separated from the main surface of the semiconductor substrate. Further, the semiconductor base layer on which the at least one device structure has been formed and separated from the main, surface of the semiconductor substrate is attached onto a main surface of a diamond substrate. Finally, the semiconductor base layer thus attached is fixed to the main surface of the diamond substrate. The semiconductor base layer is preferably formed over the main surface of the semiconductor substrate through an intervening sacrificial layer. Also, the semiconductor base layer is separated from the main surface of the semiconductor substrate by removing the sacrificial layer. The semiconductor base layer is fixed to the main surface of the diamond substrate by physical absorption or an intermolecular force such as a van der Waals force.

14 Claims, 6 Drawing Sheets

METHOD OF FABRICATING SEMICONDUCTOR DEVICE WITH DIAMOND SUBSTRATE

BACKGROUND OF THE INVENTION

1. Field of the Invention

The present invention relates to a semiconductor device and a method of fabricating the same and more particularly, to a method of fabricating a semiconductor device equipped with a diamond substrate and a device structure such as a Gallium Arsenide (GaAs) Field-Effect Transistor (FET) or FETs and a method of fabricating the semiconductor device, which provides improvement in heat dissipation performance.

2. Description of the Prior Art

With high-output semiconductor devices, a lot of heat is generated in the devices on operation and therefore, the output level lowering and/or the reliability degradation tend to occur due to the heat. The devices themselves may be damaged due to the heat. In particular, since GaAs has a higher thermal resistance than that of silicon (Si), GaAs FETs have a low heat dissipation performance than Si FETs. Thus, to improve the performance of high-output GaAs devices, it is essential to make the heat dissipation performance as high as possible.

The Japanese Non-Examined Patent Publication No. 5-166899 published in 1993 discloses a semiconductor device of this sort, which is shown in FIG. 1.

The prior-art semiconductor device of FIG. 1 is comprised of a semi-insulating GaAs substrate 600 polished to have a thickness of 30 μm. An n-type active layer 601 is formed in the surface area of the GaAs substrate 600. On the surface area of the substrate 600, a source electrode 602a, a drain electrode 602b, and a gate electrode 603 are formed. The source electrode 602a is located to overlap with one end of the active layer 601. The drain electrode 602b is located to overlap with the other end of the active layer 601. The gate electrode 603 is located approximately in the middle of the active layer 601. The active layer 601, the source and drain electrodes 602a and 602b, and the gate electrode 603 constitute a GaAs FET structure 609.

A lot of grooves 608, each of which has a depth of 2 μm and a width of 2 μm, are formed on the back surface of the GaAs substrate 600 by etching to overlap with the whole active layer 601, thereby increasing the surface area of the back surface of the GaAs substrate 600.

A Plated Heat Sink (PHS) 607 with a thickness of 30 μm is fixed to the grooved back surface of the substrate 600. The PHS 607 is made of gold (Au) and fixed by a plating process.

Because of the increased interface area of the GaAs substrate 600 and the PHS 607, the heat dissipation performance of the semiconductor device of FIG. 1 is enhanced without changing the dimension or size of the device.

However, the above-described prior-art semiconductor device of FIG. 1 has a problem that the temperature at the interface of the substrate 600 and the PHS 607 is scarcely changed. This problem is caused by the fact that the thickness of the GaAs substrate 600 is scarcely changed although the contact area of the substrate 600 and the PHS 607 is increased by formation of the grooves 608 to thereby enhance the thermal conductivity and the heat dissipation effect.

This point is explained in detail below.

Here, the area of the channel region of the FET structure 609 is defined as $A_1$ and it is supposed that all the heat generated in the channel region is propagated to the PHS 607. Then, the thermal flux $Q_1$ of the GaAs substrate 600 per unit time in the steady state is expressed by the following equation (1)

$$Q_1 = k_1(\theta_1 - \theta)\frac{A_1}{\delta_1} \quad (1)$$

where $k_1$ is the thermal conductivity of the substrate 600, $\delta_1$ is the thickness of the substrate 600, $\theta_1$ is the temperature of the heat source (i.e., the channel region), and $\theta$ is the temperature at the interface of the substrate 600 and the PHS 607.

The thermal flux $Q_2$ of the PHS 607 per unit time in the steady state is expressed by the following equation (2)

$$Q_2 = k_2(\theta - \theta_2)\frac{A_2}{\delta_2} \quad (2)$$

where $A_2$ is the area of the interface of the substrate 600 and the PHS 607, $k_2$ is the thermal conductivity of the PHS 607, $\delta_2$ is the thickness of the PHS 607, and $\theta_2$ is the temperature at the outer surface of the PHS 607 contacting with the atmosphere.

When the thermal conductivity, the thickness, and the cross-sectional area of a material are defined as k, δ, and A, respectively, the thermal resistance R of the material is generally given by $$R = \frac{\delta}{kA} \quad (3)$$

Therefore, the following equations (4) and (5) are established.

$$R_1 = \frac{\delta_1}{k_1 A_1} \quad (4)$$

$$R_2 = \frac{\delta_2}{k_2 A_2} \quad (5)$$

Therefore, by using the equations (4) and (5), the above-described equations (1) and (2) are rewritten to as follows.

$$Q_1 = \frac{\theta_1 - \theta}{R_1} \quad (1')$$

$$Q_2 = \frac{\theta - \theta_2}{R_2} \quad (2')$$

Considering the flow of heat in the steady state, $Q_1 = Q_2$ is established. Also, it is supposed that the substrate 600 and the PHS 607 are equal in thickness and area to each other, the temperature θ at the substrate-PHS interface is given as a function of the thermal conductivities $k_1$ and $k_2$ and temperatures $\theta_1$ and $\theta_2$ as follows.

$$\theta = \frac{k_1\theta_1 + k_2\theta_2}{k_1 + k_2} \quad (6)$$

When $\theta_1 = 100°$ C., $\theta_2 = 40°$ C., $k_1 = 0.46$ W/cm° C., and $k_2 = 3.2$ W/cm° C., the equation (6) gives θ=47.5° C.

The above explanation is applied to the case where the grooves 608 are omitted in the prior-art semiconductor device of FIG. 1. On the other hand, with the prior-art semiconductor device of FIG. 1 having the grooves 608, the temperature θ at the interface of the substrate 600 and the PHS 607 is given as follows.

It is supposed that the contact area $A_m$ of the substrate 600 and the PHS 607 is twice as much as that of the above-described case where the grooves 608 are omitted (i.e., $A_m=2A_1$) while the area $A_1$ of the channel region is unchanged. Then, the thermal conduction from the area $A_1$ to the area $A_m$ (=$2A_1$) is approximated to the planar conduction model of heat by using the logarithmically averaging conversion method, resulting in the following equation (7)

$$Q_1 = k_1(\theta_1 - \theta)\frac{A_m}{\delta_1} \quad (7)$$

where the area $A_m$ is given by the following expression (8).

$$A_m = \frac{A_1}{\ln(2)} \cong 1.44 A_1 \quad (8)$$

It is supposed that the PHS 607 has a heat dissipation area twice as much as that of the area $A_1$. Then, the following equation (9) is obtained.

$$Q_2 = k_2(\theta - \theta_2)\frac{2A_1}{\delta_2} \quad (9)$$

Since Q1=Q2 is established in the steady state, the following equation (10) is obtained.

$$\theta = \frac{1.44 k_1 \theta_1 + 2 k_2 \theta_2}{1.44 k_1 + 2 k_2} \quad (10)$$

When $\theta_1=100°$ C., $\theta_2=40°$ C., $k_1=0.46$ W/cm° C., and $k_2=3.2$ W/cm° C., which is the same condition as that of the above-described equation (6), the equation (10) gives θ=45.6° C.

As seen from this result, even if the interface area (or contact area) of the GaAs substrate 600 and the PHS 607 is twice as much as that of the case where the grooves 608 are omitted, the temperature θ at the substrate-PHS interface is decreased by only approximately 2° C. In other words, the temperature lowering rate (i.e., temperature gradient) in the GaAs substrate 600 is as low as 1.81° C./μm.

SUMMARY OF THE INVENTION

Accordingly, an object of the present invention to provide a semiconductor device having a decreased thermal resistance and a method of fabricating the semiconductor device.

Another object of the present invention to provide a semiconductor device having an improved heat dissipation performance and a method of fabricating the semiconductor device.

Still another object of the present invention to provide a semiconductor device having an improved radio-frequency (RF) characteristics and a method of fabricating the semiconductor device.

The above objects together with others not specifically mentioned will become clear to those skilled in the art from the following description.

According to a first aspect of the present invention, a semiconductor device is provided, which is comprised of a diamond substrate having a main surface, a semiconductor base or supporting layer attached onto the main surface of the diamond substrate, and a device structure formed on the semiconductor base layer.

With the semiconductor device according to the first aspect of the present invention, the device structure, which is formed on the semiconductor base layer, is located on the main surface of the diamond substrate. The diamond substrate has a thermal conductivity higher than that of a semiconductor substrate such as a GaAs substrate. Thus, the total thermal resistance of the semiconductor device according to the first aspect of the present invention is decreased compared with a semiconductor device equipped with a semiconductor substrate. In other words, the semiconductor device according to the first aspect of the present invention has an improved heat dissipation performance.

Also, since the diamond substrate has a better electrical insulation property than a semiconductor substrate, the semiconductor device according to the first aspect of the present invention has an improved RF characteristics.

In the device according to the first aspect, as the diamond substrate, any diamond substrate having a good electrical insulating property may be used. The diamond substrate may be natural or artificial.

In a preferred embodiment of the device according to the first aspect, the semiconductor base layer is fixed to the main surface of the substrate by physical absorption or an intermolecular force such as a van der Waals force.

In another preferred embodiment of the device according to the first aspect, the device structure is a FET structure having a semiconductor active layer formed on or in the semiconductor base layer, a source electrode contacted with one end of the active layer, a drain electrode contacted with the other end of the active layer, and a gate electrode contacted with the active layer between the source and drain electrodes.

In still anther preferred, embodiment of the device according to the first aspect, the diamond substrate has a heat sink attached to a back surface of the diamond substrate.

According to a second aspect of the present invention, a method of fabricating a semiconductor device is provided, which is comprised of the following steps (a) to (d).

(a) A semiconductor base or supporting layer is formed over a main surface of a semiconductor substrate.

(b) At least one device structure is formed on the semiconductor base layer.

(c) The semiconductor base layer on which the at least one device structure has been formed is separated from the main surface of the semiconductor substrate.

(d) The semiconductor base layer on which the at least one device structure has been formed and separated from the main surface of the semiconductor substrate is attached onto a main surface of a diamond substrate. The semiconductor base layer thus attached is fixed to the main surface of the diamond substrate.

With the method according to the second aspect of the present invention, the semiconductor device according to the first aspect is fabricated.

In a preferred embodiment of the method according to the second aspect, the semiconductor base layer is formed over the main surface of the semiconductor substrate through an intervening sacrificial layer in the step (a). Also, the semiconductor base layer is separated from the main surface of the semiconductor substrate by removing the sacrificial layer in the step (c).

In another preferred embodiment of the method according to the second aspect, the semiconductor base layer is fixed to the main surface of the diamond substrate by physical absorption or an intermolecular force such as a van der Waals force in the step (d).

In still another preferred embodiment of the method according to the second aspect, a plurality of the device structures are formed on the semiconductor base layer in the step (b). The plurality of the device structures are divided from each other by dicing the semiconductor base layer and the semiconductor substrate prior to the step (c).

According to a third aspect of the present invention, another method of fabricating a semiconductor device is provided, which is comprised of the following steps (a') to (d').

(a') A semiconductor base or supporting layer is formed over a main surface of a semiconductor substrate.

(b') The semiconductor base layer is separated from the main surface of the semiconductor substrate.

(c') The semiconductor base layer that has been separated from the main surface of the semiconductor substrate is attached onto a main surface of a diamond substrate. The semiconductor base layer thus attached is fixed to the main surface of the diamond substrate.

(d') At least one device structure is formed on the semiconductor base layer that has been fixed to the main surface of the diamond substrate.

With the method according to the third aspect of the present invention, the semiconductor device according to the first aspect is fabricated.

In a preferred embodiment of the method according to the third aspect, the semiconductor base layer is formed over the main surface of the semiconductor substrate through an intervening sacrificial layer in the step (a'). Also, the at least one device structure is separated from the main surface of the semiconductor substrate by removing the sacrificial layer in the step (b').

In another preferred embodiment of the method according to the third aspect, the semiconductor base layer is fixed to the main surface of the diamond substrate by physical absorption or an intermolecular force such as a van der Waals force in the step (c').

In still another preferred embodiment of the method according to the third aspect, a plurality of the device structures are formed on the semiconductor base layer in the step (d'). The plurality of the device structures are divided from each other by dicing the semiconductor base layer and the diamond substrate next to the step (d').

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
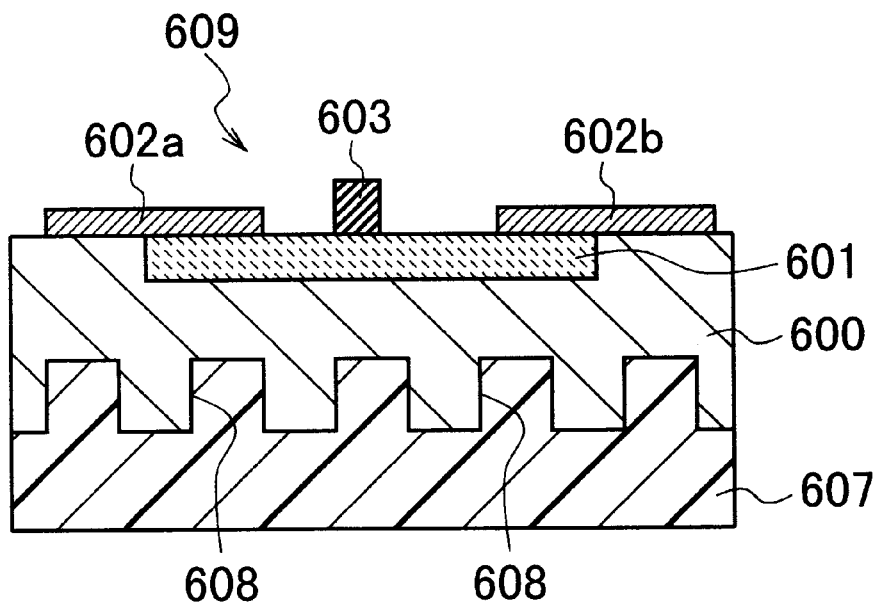
FIG. 1 is a partial cross-sectional view showing a prior-art semiconductor device equipped with a semiconductor substrate and a PHS.

Preferred embodiments of the present invention will be described in detail below while referring to the drawings attached.

First Embodiment

A semiconductor device according to a first embodiment of the present invention is explained below with reference to FIG. 2.

Figure 2:
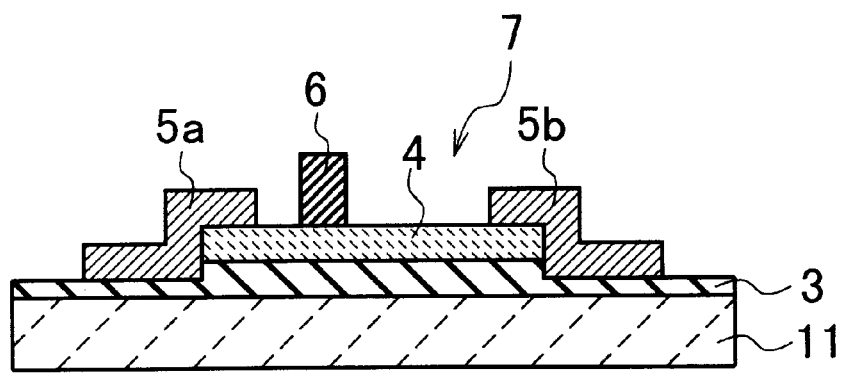
FIG. 2 is a partial cross-sectional view showing a semiconductor device equipped with a diamond substrate according to a first embodiment of the present invention.

As shown in FIG. 2, the semiconductor device according to the first embodiment is comprised of a diamond substrate 11, an undoped GaAs layer 3 fixed onto a main surface of the diamond substrate 11, and a FET structure 7 formed on the undoped GaAs layer 3. The undoped GaAs layer 3 serves as a semiconductor base or supporting layer of the FET structure 7.

The diamond substrate 11, which is of single-crystal, has a better electrical insulation property (i.e., lower electrical conductivity) and a better thermal conduction property (i.e., higher thermal conductivity) than those of a GaAs substrate.

The FET structure 7 has an n-type GaAs active layer 4 formed on the undoped GaAs layer 3, a source electrode 5a formed on the undoped GaAs layer 3 to be contacted with one end of the n-type GaAs active layer 4, a drain electrode 5b formed on the undoped GaAs layer 3 to be contacted with the other end of the n-type GaAs active layer 4, and a gate electrode 6 formed on the n-type GaAs-active layer 4 between the source and drain electrodes 5a and 5b. On operation, a channel region is formed in the n-type GaAs active layer 4 and electrons run through the channel region.

To support the FET structure 7, the thickness of the diamond substrate 11 needs to be typically set as 25 μm to 50 μm. However, if a RF integrated circuit containing the FET structure 7 is formed on the diamond substrate 11, the thickness of the diamond substrate 11 is determined in such a way that the same impedance path/paths as that/those formed in a GaAs substrate is/are formed in the diamond substrate 11. (The accurate impedance value of each impedance path varies dependent upon the width w of wiring lines and the thickness h of the substrate.) Typically, the thickness of the diamond substrate 11 is decreased by approximately 40% with respect to that of a GaAs substrate, because the relative dielectric constant of the diamond substrate 11 is 5 to 8, which is less than the relative dielectric constant (i.e., 13.1) of a GaAs substrate.

Here, from the above-described equations (1) and (2), the temperature θ at the interface of the diamond substrate 11 and the undoped GaAs layer 3 is given by the following equation (11).

$$\theta = \frac{\frac{k_1\theta_1}{\delta_1} + \frac{k_2\theta_2}{\delta_2}}{\frac{k_1}{\delta_1} + \frac{k_2}{\delta_2}} \tag{11}$$

When the thickness of the GaAs active layer 4 is 0.10 μm, the thickness $\delta_1$ of the GaAs base layer 3 is 1.9 μm, the temperature $\theta_1$ of the GaAs base layer 3 is 150° C., the thermal conductivity $k_2$ of the diamond substrate 11 is 4 W/cm° C., the thickness $\delta_2$ of the diamond substrate 11 is 30

μm, the temperature $\theta_2$ of the outer surface of the diamond substrate 11 contacting with the atmosphere is 30° C., the temperature θ at the interface of the GaAs layer 3 and the diamond substrate 11 is given as θ=105.9° C. Thus, the temperature decreasing rate (i.e. temperature gradient) of the GaAs layer 3 is 22° C./μm.

If the thickness $\delta_1$ of the GaAs layer 3 is 2 μm, the temperature $\theta_1$ of the GaAs layer 3 is 100° C., the thickness 62 of the diamond substrate 1 is 30 μm, the temperature $\theta_1$ of the diamond substrate 11 is 40° C., the temperature θ at the interface of the GaAs layer 3 and the diamond substrate 11 is given as θ=75.9° C. Thus, the temperature decreasing rate (i.e. temperature gradient) of the GaAs layer 3 is 12.05° C./μm, which is greater than that of the prior-art semiconductor device shown in FIG. 1 by 10° C./μm or greater.

Next, a fabrication method of the semiconductor device according to the first embodiment of FIG. 2 is explained below with reference to FIGS. 3A to 3F.

Figure 3A:
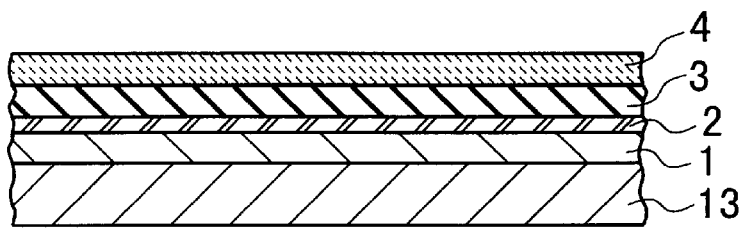
FIGS. 3A to 3G are partial cross-sectional views showing a method of fabricating the semiconductor device according to the first embodiment of FIG. 2, respectively.

First, as shown in FIG. 3A, an undoped GaAs layer 1 (e.g., 1 μm in thickness) is formed on a main surface of a semi-insulating GaAs substrate or wafer 13. Then, an undoped Aluminum Arsenide (AlAs) layer 2 (e.g., 2 nm in thickness), which serves as a sacrificial layer, is formed on the undoped GaAs layer 1. An undoped GaAs layer 3 (e.g., 100 nm in thickness), which serves as a base or supporting layer, is formed on the undoped AlAs layer 2. An undoped GaAs active layer 4 (e.g., 50 nm in thickness) is formed on the undoped GaAs layer 3. These four layers 1, 2, 3, and 4 are formed by using a Molecular Beam Epitaxial (MBE) growth apparatus. The state at this stage is shown in FIG. 3A.

Figure 3B:
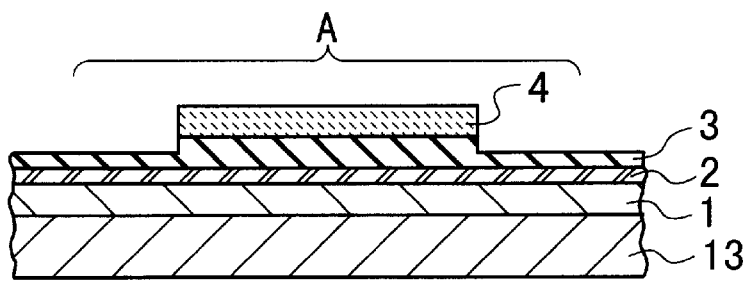

Subsequently, the undoped GaAs active layer 4 is selectively removed by dry etching, thereby leaving active areas A arranged on the GaAs substrate or wafer 13, as shown in FIG. 3B. The FET structure 7 is formed in each of the active areas A. During this dry etching process, upper parts of the undoped GaAs layer 3 are removed in the active areas A.

Figure 3C:
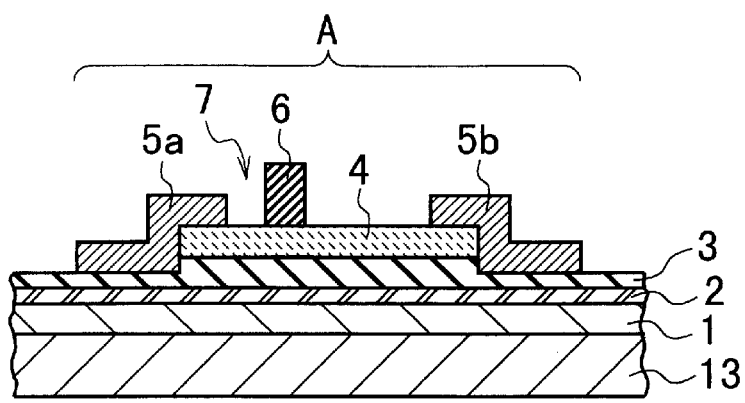

Following this, the source and drain electrodes 5a ad 5b are formed on the undoped GaAs layer 3 to be contacted with each end of the n-type GaAs active layer 4 by a known method in each active area A, as shown in FIG. 3C. To form Ohmic contacts of the source and drain electrodes 5a and 5b with the GaAs layer 4, a known heat treatment is performed. Thereafter, the gate electrode 6 is formed on the n-type GaAs active layer 4 between the source and drain electrodes 5a and 5b by a known method in each active area A.

Figure 3D:
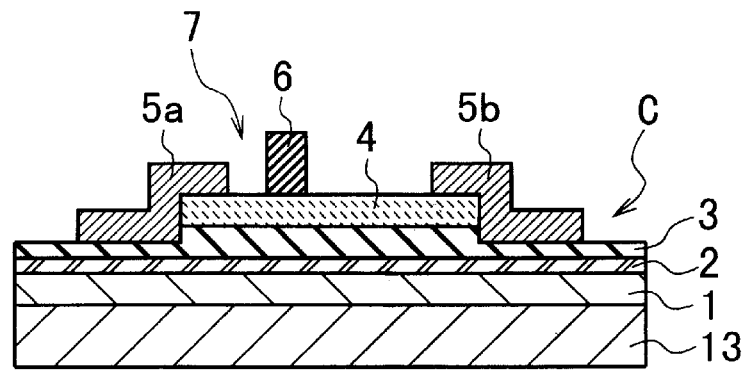

Thereafter, the active areas A on the GaAs substrate 13 are divided into device chips C by dry etching using a resist, or oxide film as a mask, as shown in FIG. 3D. In other words, the GaAs substrate or wafer 13 is subjected to a dicing process, thereby separating the active areas A from each other to result in the device chips C.

Figure 3E:
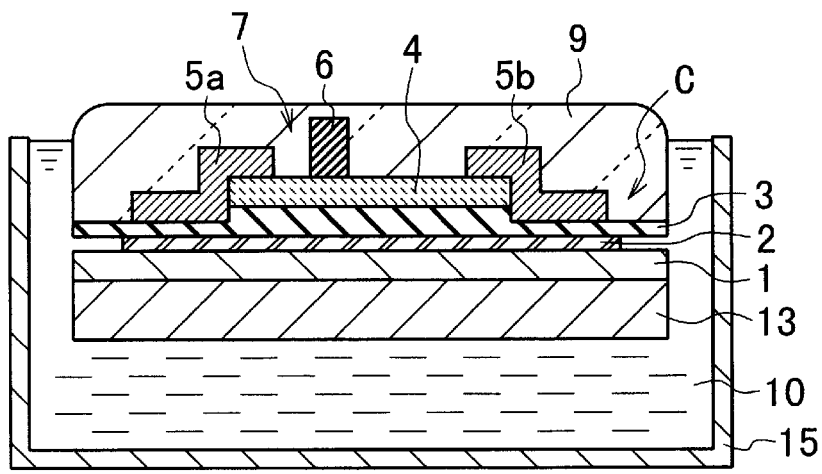

To perform an epitaxial lift-off process, the FET structure 7 on each device chip C is covered with a wax-like film 9 by coating, as shown in FIG. 3E. The wax-like film 9 may be produced by using an organic material such as "Apiezon W" diluted by an organic solvent such as trichloroethylene. Then, the chip C covered with the wax-like film 9 is immersed in a hydrogen fluoride (HF) solution 10 stored in a container 15 for a specific time period, as shown in FIG. 3E. Since only the AlAs layer 2 is etched away in the HF solution 10, the combination of the undoped GaAs layer 3 and the FET structure 7 covered with the wax-like film 9 is separated from the main surface of the GaAs substrate 13.

Figure 3F:
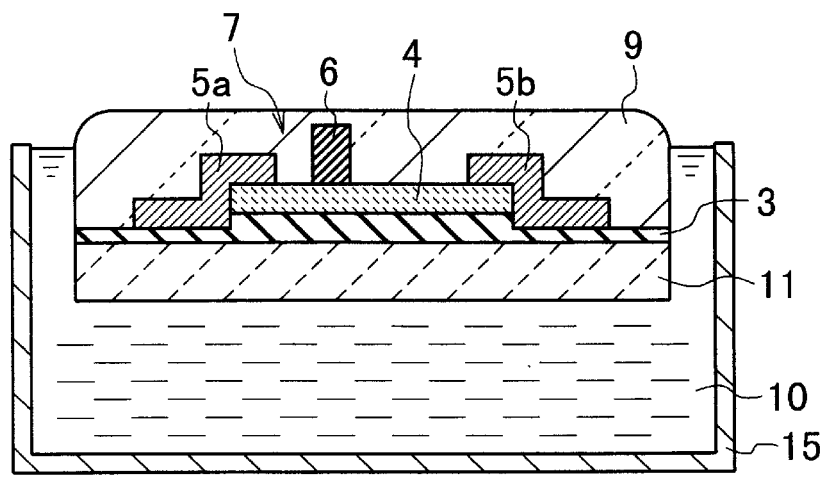

A diamond substrate 11 is immersed in the HF solution 10 and then, a main surface of the diamond substrate 11 is contacted with the exposed bottom surface of the undoped GaAs layer 3 of the device chip C in the HF solution 10. At this stage, the main surface of the diamond substrate 11 is strongly fixed to the exposed surface of the undoped GaAs layer 3 of the device chip C by an interatomic force such as a van der Waals force due to physical absorption, as shown in FIG. 3F.

Figure 3G:
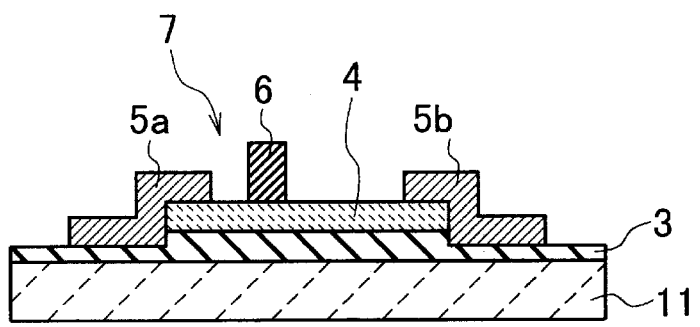

After the device chip C fixed to the main surface of the diamond substrate 11 is taken out of the HF solution 10, the wax-like film 9 is removed by an organic cleaning solution such as trichloroethylene. Then, the device chip C is dried, resulting in the semiconductor device according to the first embodiment of FIG. 2, as shown in FIG. 3G.

With the semiconductor device according to the first embodiment of FIG. 2, since the combination of the GaAs layer 3 and the FET structure 7 on each device chip C is formed on the diamond substrate 11 having a higher thermal conductivity than that of a GaAs substrate, the thermal resistance of the semiconductor device according to the first embodiment can be decreased. Also, the diamond substrate 11 has a better insulating characteristic than a GaAs substrate and therefore, the semiconductor device according to the first embodiment makes it possible to form a RF integrated circuit device.

Second Embodiment

Figure 4:
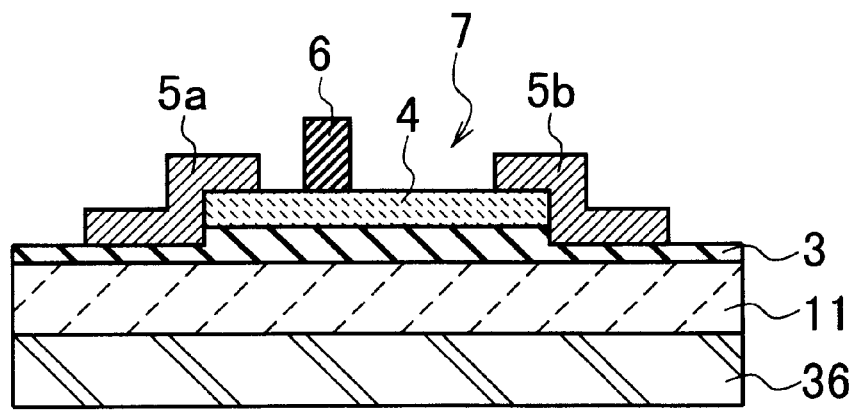
FIG. 4 is a partial cross-sectional view showing a semiconductor device equipped with a diamond substrate according to a second embodiment of the present invention.

FIG. 4 shows a semiconductor device according to a second embodiment of the present invention, in which a PHS 36 is additionally provided to the semiconductor device according to the first embodiment of FIG. 2.

The PHS 36, which is plate-shaped, is attached onto the back surface of the diamond substrate 11. For example, the PHS 36 is made of gold (Au) and 30 μm in thickness.

The device according to the second embodiment is fabricated in the same way as that of the first embodiment except that the PHS 36 is attached to the back surface of the diamond substrate 11 by a plating process.

Third Embodiment

Figure 5:
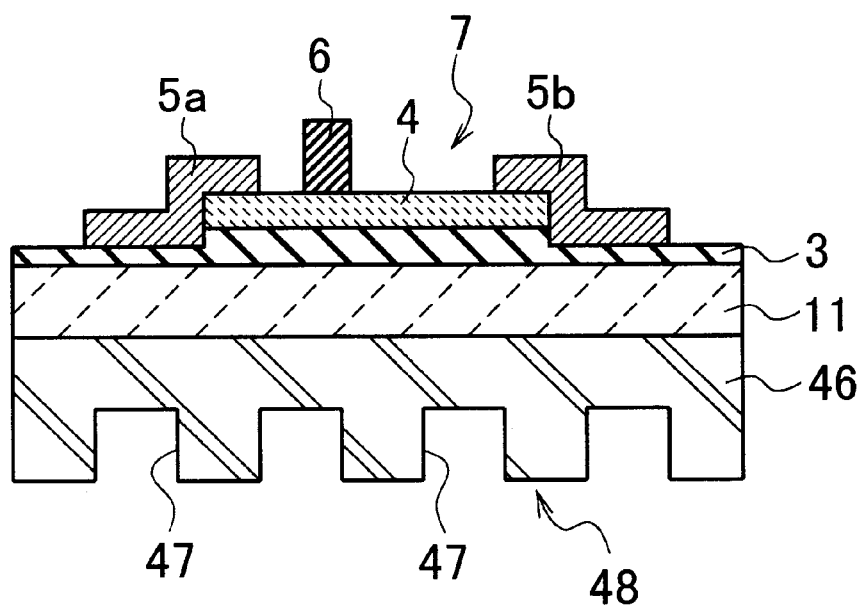
FIG. 5 a is partial cross-sectional view showing a semiconductor device equipped with a diamond substrate and a PHS according to a third embodiment of the present invention.

FIG. 5 shows a semiconductor device according to a third embodiment of the present invention, in which a PHS 46 is additionally provided to the semiconductor device according to the first embodiment of FIG. 2.

The PHS 46 is attached onto the back surface of the diamond substrate 11. For example, the PHS 46 is made of gold (Au) and 30 μm in thickness. Unlike the second embodiment of FIG. 4, the PHS 46 has grooves 47 and fins 47 on an opposite surface of the PHS 46 to the substrate 11, thereby increasing the surface area of the PHS 46 to result in improvement in heat dissipation performance.

The device according to the third embodiment is fabricated in the same way as that of the first embodiment except that the PHS 46 is attached to the substrate 11 by plating.

Fourth Embodiment

FIGS. 6A to 6F show a method of fabricating a semiconductor device according to a fourth embodiment of the present invention, in which the semiconductor device according to the first embodiment of FIG. 2 is fabricated.

Figure 6A:
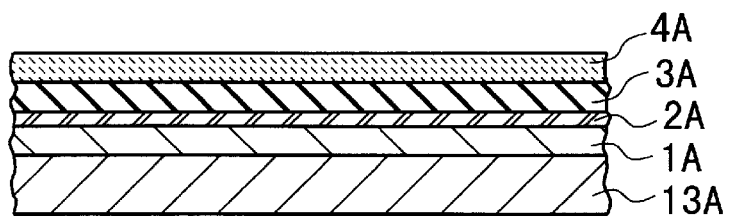
FIGS. 6A to 6F are partial cross-sectional views showing a method of fabricating a semiconductor device according to a fourth embodiment of the present invention, respectively.

First, as shown in FIG. 6A, an undoped GaAs layer 1A (e.g., 1 μm in thickness) is formed on a main surface of a semi-insulating GaAs substrate or wafer 13A. Then, an undoped AlAs layer 2A (e.g., 2 nm in thickness) is formed on the undoped GaAs layer 1A. An undoped,GaAs layer 3A (e.g., 100 nm in thickness), which serves as the base layer, is formed on the undoped AlAs layer 2A. An undoped GaAs active layer 4A (e.g., 50 nm in thickness), which serves as the active layer, is formed on the undoped GaAs layer 3A. These four layers 1A, 2A, 3A, and 4A are formed by using a MBE growth apparatus. The state at this stage is shown in FIG. 6A, which is the same as that shown in FIG. 3A.

Figure 6B:
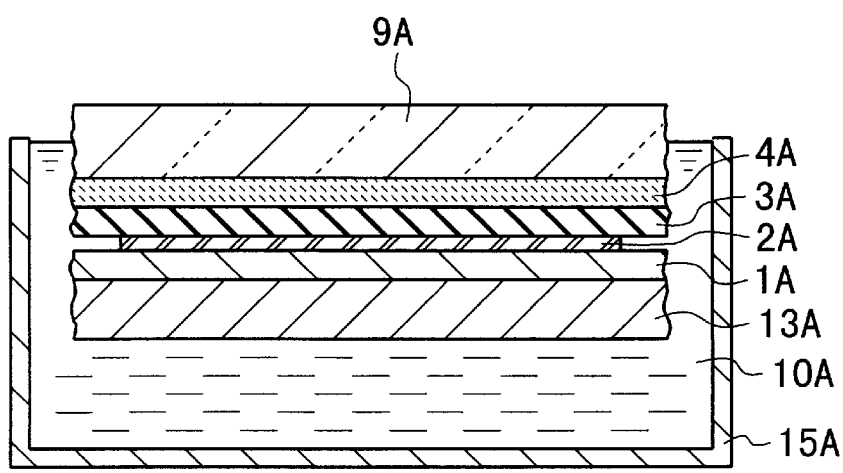

Subsequently, the surface of the undoped GaAs active layer 4A is covered with a wax-like film 9A by coating. As the wax-like film 9A, the wax-like film 9 used in the first embodiment may be used. Then, the GaAs substrate or wafer 13A covered with the wax-like film 9A is immersed in a HF solution 10A stored in a container 15A for a specific time period, as shown in FIG. 6B. Since only the AlAs layer 2A, which serves as a sacrificing layer, is etched away in the HF solution 10A, the combination of the stacked GaAs layers 3A and 4A covered with the wax-like film 9A is separated from the combination of the GaAs substrate 13A and the GaAs layer 1A.

Figure 6C:
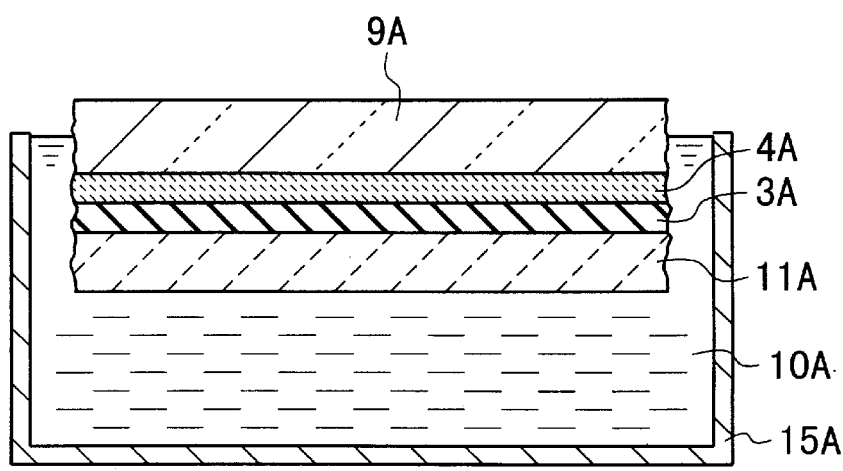

A diamond substrate or wafer 11A is immersed in the HF solution 10A and then, a main surface of the diamond substrate 11A is contacted with the exposed surface of the undoped GaAs layer 3A in the HF solution 10A. At this stage, the main surface of the diamond substrate 11A is strongly fixed to the exposed surface of the undoped GaAs layer 3A by a van der Waals force due to physical absorption. The state at this stage is shown in FIG. 6C.

Figure 6D:
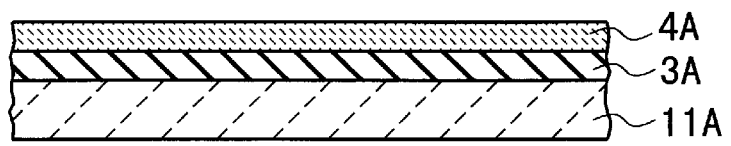

After the diamond substrate 11A with the GaAs layers 3A and 4A is taken out of the HF solution 10A, the wax-like film 9A is removed by an organic cleaning solution such as trichloroethylene. Then, the diamond substrate or wafer 1A with the GaAs layers 3A and 4A is dried. The state at this stage is shown in FIG. 6D.

Figure 6E:
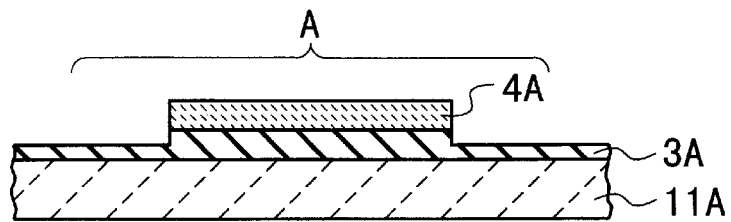

Subsequently, the undoped GaAs active layer 4A on the diamond wafer 11A is selectively removed by dry etching, thereby leaving active areas A arranged on the diamond wafer 11A, as shown in FIG. 6E. A FET structure 7A is formed in each of the active areas A. During this dry etching process, upper parts of the undoped GaAs layer 3A are removed in the active areas A.

Figure 6F:
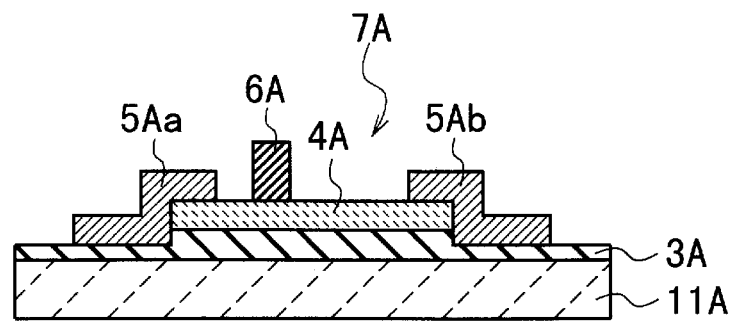

Source and drain electrodes 5Aa and 5Ab are then formed on the undoped GaAs layer 3A to be contacted with each end of the n-type GaAs active layer 4A by a known method in each active area A, as shown in FIG. 6F. To form Ohmic contacts of the source and drain electrodes 5Aa and 5Ab with the layer 4A, a known heat treatment is performed. Thereafter, a gate electrode 6A is formed on the n-type GaAs active layer 4A between the source and drain electrodes 5Aa and 5Ab by a known method in each active area A.

Following this step, the active areas A on the diamond 11A are divided into device chips C by dry etching using a resist or oxide film as a mask, as shown in FIG. 6F. In other words, the diamond wafer or substrate 13A is subjected to a dicing process, separating the active areas A from each other to result in the semiconductor device.

With the method according to the fourth embodiment, as described above, the semiconductor device according to the first embodiment of FIG. 2 is fabricated.

In the above-described embodiments, GaAs layers are used for forming the FET structure 7 and a AlAs layer is used as the sacrificial layer. However, any other semiconductor layer than a GaAs layer may be used for the structure 7 and any other layer than an AlAs layer may be used for this purpose.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A method of fabricating a semiconductor device, comprising the steps of:
   (a) forming a semiconductor base layer over a main surface of a semiconductor substrate;
   (b) forming at least one device structure on said semiconductor base layer;
   (c) separating said semiconductor base layer on which said at least one device structure has been formed from said main surface of said semiconductor substrate; and
   (d) attaching said semiconductor base layer on which said at least one device structure has been formed and separated from said main surface of said semiconductor substrate onto a main surface of a diamond substrate; wherein said semiconductor base layer thus attached is fixed to said main surface of said diamond substrate.

2. The method as claimed in claim 1, wherein said semiconductor base layer is formed over said main surface of said semiconductor substrate through an intervening sacrificial layer in the step (a);
   and wherein said semiconductor base layer is separated from said main surface of said semiconductor substrate by removing said sacrificial layer in the step (c).

3. The method as claimed in claim 1, wherein said semiconductor base layer is fixed to said main surface of said diamond substrate by physical absorption in the step (d).

4. The method as claimed in claim 1, wherein said semiconductor base layer is fixed to said main surface of said diamond substrate by an intermolecular force such as a van der Waals force in the step (d).

5. The method as claimed in claim 1, wherein a plurality of said device structures are formed on said semiconductor base layer in the step (b);
   and wherein said plurality of said device structures are divided from each other by dicing said semiconductor base layer and said semiconductor substrate prior to the step (c).

6. The method as claimed in claim 1, wherein the step (c) is carried out by an epitaxial lift-off process.

7. The method as claimed in claim 1, further comprising a step (e) of forming a heat sink attached to a back surface of said diamond substrate.

8. A method of fabricating a semiconductor device, comprising the steps of:
   (a) forming a semiconductor base layer over a main surface of a semiconductor substrate;
   (b) separating said semiconductor base layer from said main surface of said semiconductor substrate;
   (c) attaching said semiconductor base layer that has been separated from said main surface of said semiconductor substrate onto a main surface of a diamond substrate; said semiconductor base layer thus attached being fixed to said main surface of said diamond substrate;
   (d) forming at least one device structure on said semiconductor base layer that has been fixed to said main surface of said diamond substrate.

9. The method as claimed in claim 8, wherein said semiconductor base layer is formed over said main surface of said semiconductor substrate through and intervening sacrificial layer in the step (a);

and wherein said device structure is separated from said main surface of said semiconductor substrate by removing said sacrificial layer in the step (b).

10. The method as claimed in claim 8, where in said semiconductor base layer is fixed to said main surface of said diamond substrate by physical absorption in the step (c).

11. The method as claimed in claim 8, wherein said semiconductor base layer is fixed to said main surface of said diamond substrate by an intermolecular force such as a van der Waals force in the step (c).

12. The method as claimed in claim 8, wherein a plurality of said device structures are formed on said semiconductor base layer in the step (d); and wherein said plurality of said device structures are divided from each other by dicing said semiconductor base layer and said diamond substrate next to the step (d).

13. The method as claimed in claim 8, wherein the step (b) is carried out by an epitaxial lift-off process.

14. The method as claimed in claim 8, further comprising a step (e) of forming a heat sink attached to a back surface of said diamond substrate.

\* \* \* \* \*

UNITED STATES PATENT AND TRADEMARK OFFICE
CERTIFICATE OF CORRECTION

PATENT NO.   : 6,461,889 B1
DATED        : October 8, 2002
INVENTOR(S)  : Norihiko Samoto It is certified that error appears in the above-identified patent and that said Letters Patent is hereby corrected as shown below:

Column 9,
Line 30, delete "1A" insert -- 11A --;
Line 46, delete "agate" insert -- a gate --

Signed and Sealed this

Twenty-ninth Day of April, 2003

JAMES E. ROGAN
*Director of the United States Patent and Trademark Office*